US007928828B2

(12) United States Patent
Kahr

(10) Patent No.: US 7,928,828 B2
(45) Date of Patent: Apr. 19, 2011

(54) ELECTRICAL ASSEMBLY WITH PTC RESISTOR ELEMENTS

(75) Inventor: Werner Kahr, Deutschlandsberg (AT)

(73) Assignee: Epcos AG, Munich (DE)

( * ) Notice: Subject to any disclaimer, the term of this patent is extended or adjusted under 35 U.S.C. 154(b) by 569 days.

(21) Appl. No.: 11/937,107

(22) Filed: Nov. 8, 2007

(65) Prior Publication Data

US 2009/0251276 A1 Oct. 8, 2009

(30) Foreign Application Priority Data

Nov. 10, 2006 (DE) ......................... 10 2006 053 085

(51) Int. Cl.
*C30B 35/00* (2006.01)

(52) U.S. Cl. ...................................... 338/22 R; 338/237

(58) Field of Classification Search ................ 338/22 R, 338/235, 237, 22 SD
See application file for complete search history.

(56) References Cited

U.S. PATENT DOCUMENTS

| | | | | |
|---|---|---|---|---|
| 4,222,024 A | | 9/1980 | Ekowicki | |
| 4,823,064 A | * | 4/1989 | Prager et al. | 318/783 |
| 4,939,498 A | | 7/1990 | Yamada et al. | |
| 5,153,555 A | * | 10/1992 | Enomoto et al. | 338/22 R |
| 5,210,516 A | * | 5/1993 | Shikama et al. | 338/22 R |
| 5,382,938 A | | 1/1995 | Hansson et al. | |
| 5,504,371 A | | 4/1996 | Niimi et al. | |
| 5,798,685 A | | 8/1998 | Katsuki et al. | |
| 6,169,472 B1 | | 1/2001 | Kahr | |
| 6,933,829 B2 | * | 8/2005 | Schopf et al. | 338/22 R |
| 2004/0090303 A1 | | 5/2004 | Schopf et al. | |
| 2006/0139831 A1 | | 6/2006 | Huemer et al. | |

FOREIGN PATENT DOCUMENTS

| | | |
|---|---|---|
| CN | 1140887 | 1/1997 |
| CN | 1481560 | 3/2004 |
| DE | 3905443 | 2/1989 |
| DE | 69114322 | 6/1996 |
| DE | 69122216 | 4/1997 |
| DE | 29720357 | 4/1998 |
| DE | 69424477 | 2/2001 |
| DE | 10243113 | 4/2004 |
| EP | 0443618 | 8/1991 |
| EP | 0487920 | 6/1992 |
| EP | 0994491 | 4/2000 |
| JP | 05-267004 | 10/1993 |
| WO | WO01/52275 | 7/2001 |
| WO | WO02/49047 | 6/2002 |
| WO | WO2004/028126 | 4/2004 |

OTHER PUBLICATIONS

Machine Translation of JP05-267004 (Publication Date Oct. 15, 1993).

Search Report in Application No. EP07120090.1, dated Dec. 17, 2008.

Search Report in Application No. EP07120093.5, dated Dec. 17, 2008.

English Translation of Examination Report in Chinese Application No. 200710159618.2, dated Aug. 16, 2010.

* cited by examiner

*Primary Examiner* — Kyung Lee
(74) *Attorney, Agent, or Firm* — Fish & Richardson P.C.

(57) ABSTRACT

An electrical assembly includes a housing and at least two PTC (Positive Temperature Coefficient) resistor elements in the housing. Each of the at least two PTC resistor elements includes a body having a flat construction and electrodes on main surfaces of the body. Each of the at least two PTC resistor elements includes an electrically insulating envelope. The housing is closed.

16 Claims, 6 Drawing Sheets

ELECTRICAL ASSEMBLY WITH PTC RESISTOR ELEMENTS

CROSS-REFERENCE TO RELATED APPLICATION

Under 35 U.S.C. §119, this application claims the benefit of a foreign priority application filed in Germany, serial number 102006053085.3, filed Nov. 10, 2006. The contents of German application serial number 102006053085.3 are herby incorporated by reference into this application as if set forth herein in full.

BACKGROUND

An electrical assembly, which includes a protective device for suppressing interference on signal lines on the basis of PTC resistor elements, is known, for example, from the publication DE 10243113 A1.

SUMMARY

Described herein is an electrical assembly, which represents a protective device safe from sparking, from high current loading and high transient current pulses for protecting signal lines.

An electrical assembly with a closed housing and with at least two resistor elements which are arranged in the housing is described. The resistor elements each have a body with a flat structure and electrodes arranged on its main surfaces. An electrically insulating envelope covers each resistor element.

The resistor elements may exhibit PTC properties. PTC stands for Positive Temperature Coefficient.

In principle, it is possible to arrange, instead of several resistor elements, only one resistor element or more than two resistor elements in a closed housing.

The envelope is advantageous for guaranteeing the function of the assembly, which includes limiting current for protecting against overvoltages in the form of transient pulses. The resistance of the resistor elements increases due to the heating of the body, which is caused by the current pulse. By detaching the resistor element above a provided protection level, the current is limited.

The envelope protects from arcing events between the resistor elements and therefore gives the assembly a high dielectric strength. This is advantageous if a separating device between the resistor elements must be eliminated in order to save space.

The assembly fulfills the requirements described above in terms of long-term loading through alternating voltage with a high current intensity that can appear in the signal line to be protected. In the case of errors, the body could become thermally destroyed. If the resistor elements are destroyed, in certain circumstances, sparks or even a flame could be produced, which could be trapped by the housing. The enclosed housing made from fire-resistant, i.e., non-combustible, material protects the surroundings from the risk of fire.

The housing material may have a high thermal capacity. Thus, in particular, in the case of errors the heat transfer to a circuit board on which the assembly is mounted is prevented.

The assembly can guarantee its function, especially current limiting above a given protection level, under the following test conditions:

a) pulse 2500 V, 500 A, pulse width 2/10 μs;

b) alternating voltage 600 V, 3A, time period 1.1 s.

Despite the destruction of the resistor elements, the fire resistance of the assembly is guaranteed under the following test conditions:

a) pulse 5000 V, 500 A, pulse width 2/10 μs;

b) alternating voltage 600 V, 60A, time period 5.0 s.

The pulse width of 2/10 μs means that the rise time equals 2 μs and the fall time equals 10 μs.

Below, advantageous constructions of the assembly are described, which can be combined with each other arbitrarily.

The PTC resistor elements in principle replace safety fuses and have the economical advantage that they are indeed triggered for a transient exceeding a protection level and do limit the current, but nevertheless remain functional. Only when a maximum current intensity is exceeded will the resistor element be destroyed.

In a variant, a resistor element of the assembly is provided for each signal line of a telephone connection. Because a telephone connection includes an incoming and outgoing line, that is, two signal lines, two resistor elements are provided. The resistor elements form protective devices, in order to prevent the risk of defects, especially a dropped line, caused by interference on the telephone line. The interference could be caused, e.g., by a lightning strike. Also, power lines could induce overvoltages in the telephone line if they come into contact.

Each resistor element may be arranged in a series branch of the signal line. If a maximum current intensity is exceeded, this causes a break due to the destruction of the resistor element.

The resistor elements may have the same resistance values within the permissible tolerance. Tight tolerance limits are advantageous in this respect.

The body may contains a material with PTC properties. The body may contain a sintered ceramic material, for example, on the basis of barium titanate. In one variant, the body contains a portion of lead. Through an advantageously selected composition of ceramic components, it is possible to eliminate the lead. The lead-free assemblies are environmentally friendly.

The resistor element or its body is characterized by a resistance versus temperature characteristic curve. Up to a switch point, the resistance is essentially a linear function of temperature. At a temperature above the switch point, the resistance value increases non-linearly approximately and, indeed, very rapidly with temperature. The switch point depends on the material of the body.

The body may have a flat structure, e.g., that of a round disk. However, the body can also have a rectangular or some other shape. The body may have flattened or rounded edges.

The body may have a resistance of 5 to 100Ω at room temperature. The breakdown voltage of the body may be at least 600 V.

The surface area of each electrode may be less than 0.5 $cm^2$. The surface area of each electrode may be greater than 0.18 $cm^2$. The diameter of the electrode may be at least 5 mm.

The electrodes may be solderable. This can be implemented by a solderable outer layer of each electrode. The solderable outer layer may contain silver.

Long-term stable electrodes of the resistor elements that have a high current-carrying capacity can be formed, for example, through a suitable layer sequence. Each electrode includes a Cr layer as the bottommost electrode layer, i.e., turned toward the body. Another electrode layer can contain nickel. The topmost electrode layer, which may be arranged on the nickel layer, may contain silver and/or tin.

A connection wire is soldered at a soldering point to each electrode of the corresponding resistor element. The connection wire may have a round cross section, but other shapes for the connection wires are not excluded.

By soldering the connection wires, a low-impedance contact with the resistor element is guaranteed. Even under unfavorable operating conditions, a soldering point remains practically corrosion-free and distinguishes itself through a resistance value that is stable over the life of the assembly.

The soldering points and also the body may be covered by the envelope, which increases the corrosion resistance of the soldering points.

The envelope may have elastic properties and can expand or contract with temperature. Thus, thermally dependent mechanical stresses between the envelope and the resistor element can be prevented. Alternatively, the thermal expansion coefficient of the envelope can be adapted to that of the body.

For depositing the envelope onto the surface of the resistor element, the material deposition is performed in an electric field applied between the material and the surface to be coated.

The envelope can be formed, for example, by a coating layer deposited in a spraying method. For the deposition of the coating layer, a spray mist is generated. The coating droplets may be electrostatically charged. The surface of the resistor element may be electrostatically charged, but with the opposite charge polarity. Thus, the coating droplets are attracted by the surface of the resistor element. The electrostatic spraying of a coating makes it possible to achieve homogeneously thin layers to a large degree. A thin envelope has the advantage that it does not significantly increase the thermal capacity of the resistor element, which may be kept small. Thus, a homogeneous heating of the body of the resistor element and consequently a rapid and reliable detachment of this resistor element are achieved as soon as the current intensity to be limited reaches the protection level.

The envelope can contain a silicon compound. The envelope can contain a glass portion or $SiO_2$. Epoxy powder is also suitable.

The thickness of the envelope may less than 200 μm. Also a thickness less than 100 μm can be set, in principle, for guaranteeing adequate edge coverage. This applies especially for the body with flattened or rounded edges. The thickness of the envelope may be uniform both at the main surfaces and also in the region of the edges of the body.

The housing has a carrier plate, on which the resistor elements are arranged. The resistor elements may be aligned on edge.

The housing has a cover, which can be mounted on the carrier plate. The cover closes the carrier plate on all sides.

In one variant, the housing has a separating wall, which is provided between the resistor elements at least in the region of its soldering points.

The separating wall can be formed by an inner wall of the cover. The separating wall can also be formed by a part of the carrier plate. A cutout or an opening for receiving a region of the separating wall may be formed in the carrier plate.

The region of the separating wall turned downward may have a tapered cross section. This simplifies the insertion of the separating wall into the cutout or opening provided for this purpose in the carrier plate.

Openings through which the connection wires of the resistor elements are passed are formed in the carrier plate.

The region of each resistor element turned toward the carrier plate is countersunk in a cutout of the carrier plate. The cutouts of the carrier plate provided for receiving resistor elements have a stable position with minimal potential energy in terms of a rolling motion of the resistor element. For example, these cutouts can have a depth that increases in cross section perpendicular to the thickness direction of each resistor element from the inside to the outside in both opposing directions. For the rolling motion of the resistor element, a non-return force is produced, which brings it back into the stable position. Thus, the rolling away of a disk-shaped body is prevented.

The base of the cutout can be formed, for example, as a part of an envelope of a cylinder. Two surfaces, for example, planes running at an angle to the center of the cutout, are also suitable for this purpose.

The parts of the housing, i.e., the cover and the carrier plate, may each be produced as a molded part. They can be produced, e.g., in an injection molding method.

The housing contains a material that is dimensionally stable and fire-resistant up to at least 250°. Thermoplastic materials are especially well suited as materials for the housing. Duroplastics can also be used.

In principle, ceramics can also be used as the housing material. Plastics, especially polymer plastics, for example, liquid-crystalline polymers, are also suitable as housing material.

The housing material can be reinforced with glass, which is advantageous in the sense of good fire resistance. The glass portion can be, for example, between 10 and 70%.

Each resistor element is dimensioned in terms of its resistance valve, the switch point of the body material, and geometric dimensions, so that it has a protection level below 500 mA. The minimum value of the current intensity, at which the current-limiting is triggered by the resistor element, is designated as the protection level.

A lower protection level is advantageous, because in this case the circuit to be protected by the resistor element, e.g., on the side of the user, can be designed for smaller currents. A lower protection level can be set by an especially small thermal capacity of the resistor element.

An especially low protection level of below 200 mA can also be set. A large resistance value of a resistor element, e.g., at least 30Ω, e.g., at least 50Ω, is advantageous for setting an especially low protection level. The switch point of the PTC material is set by a suitable composition of this material, e.g., at 120° or below 120°. The switch point can also be selected at 100° or below, but may be at least 20° above the temperature region specified for the assembly or application.

As an alternative to a cover, the housing can have a molding compound, by which the resistor elements fixed on the carrier plate are enclosed. The resistor elements may be injection enclosed by injection molding.

Below, the specified assembly and its advantageous constructions will be explained with reference to schematic figures that are not true to scale.

DETAILED DESCRIPTION

Figure 1:
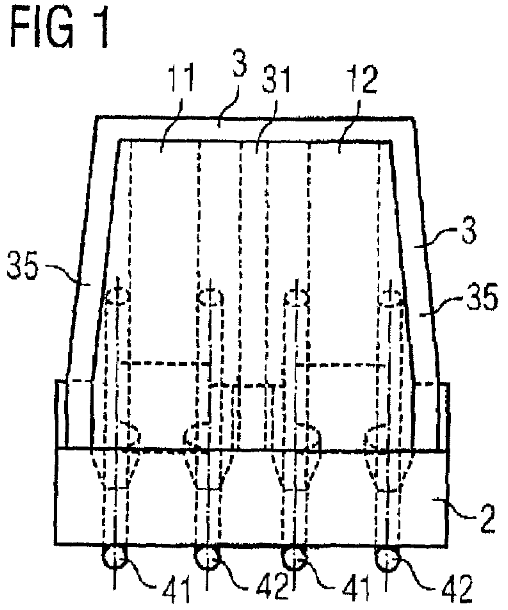
FIG. 1, a partial longitudinal section of the assembly with two disk-shaped resistor elements arranged in the closed housing.
Figure 2:
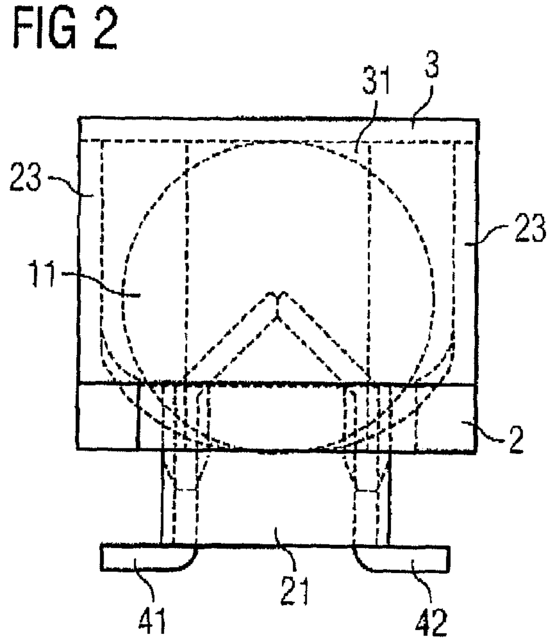
FIG. 2, the assembly according to FIG. 1 in a partial cross section.

Only one component from a number of identical components of the assembly shown in the figures will be described for reasons of clarity. However, the description applies to every component of the corresponding type. This applies for resistor elements 11, 12, soldering points 5, connection wires 41, 42, body 15, centering devices 33, recesses 27, 29, 38, cutouts 26, and openings 20, 28.

Figure 3:
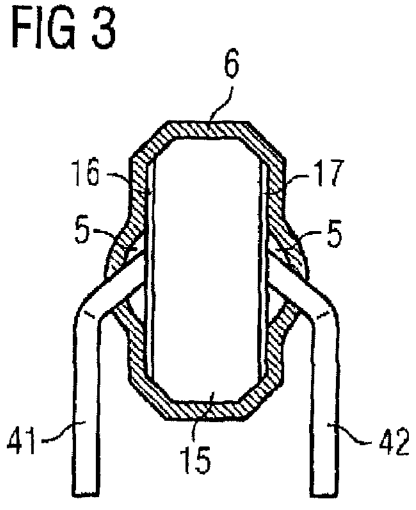
FIG. 3, a resistor element with an insulating envelope in cross section.
Figure 4:
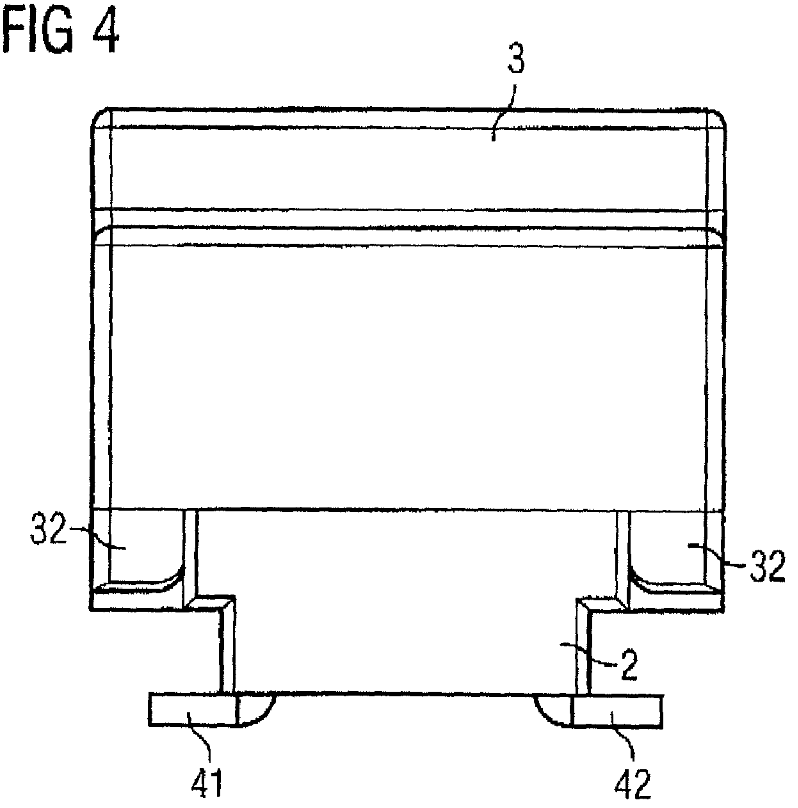
FIG. 4, a side view of the assembly according to FIG. 1.
Figure 5:
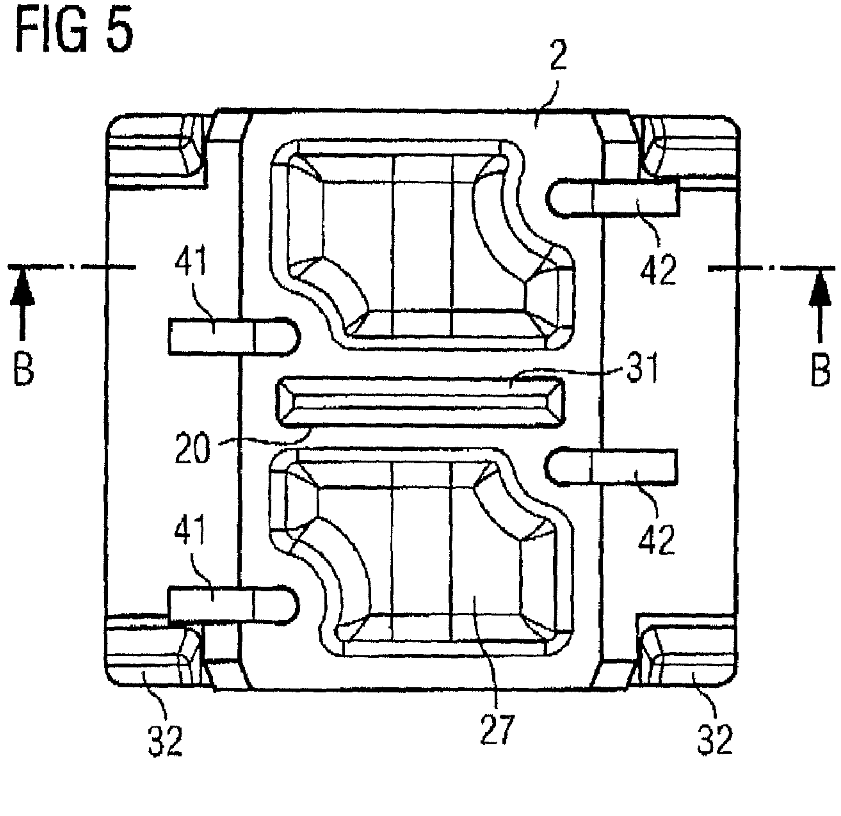
FIG. 5, a horizontal projection of the bottom side of the assembly according to FIG. 1.
Figure 14:
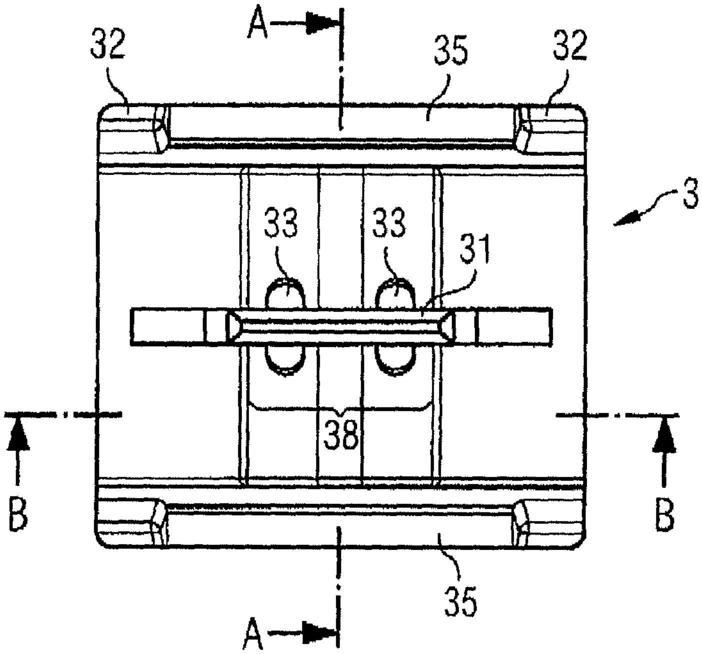
FIG. 14, a horizontal projection of the bottom side of the cover of the housing according to FIG. 8.
Figure 15:
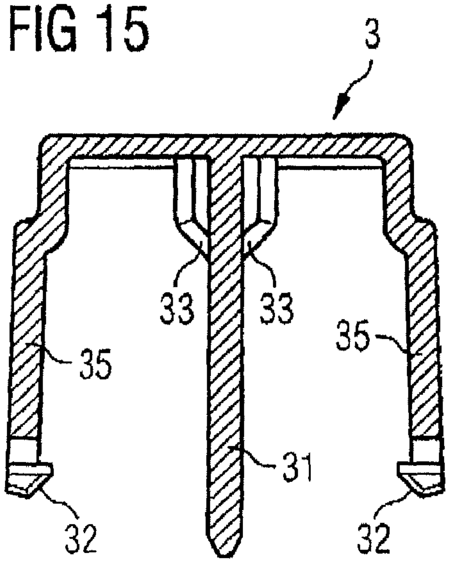
FIG. 15, the cover of the housing according to FIG. 8 in longitudinal section.
Figure 16:
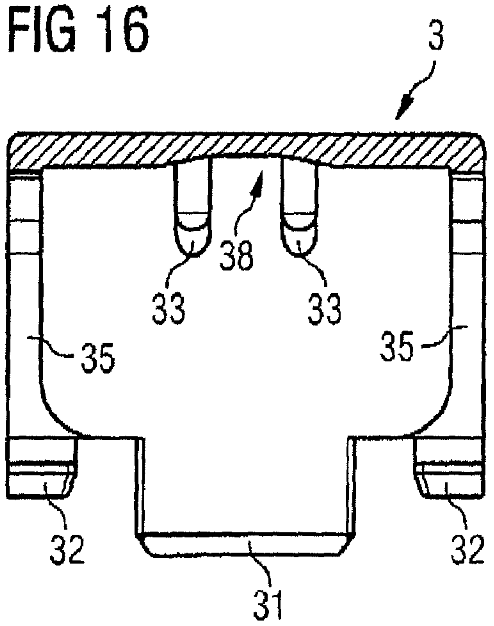
FIG. 16, the cover of the housing according to FIG. 8 in partial cross section.

The assembly with resistor elements 12, 13 and a housing, which has a carrier plate 2 and a cover 3, is presented in FIGS. 1, 2, 6, and 7. The resistor element is shown in FIG. 3. The housing with the cover and the carrier plate attached to it is shown in FIGS. 4, 5, 8, and 9. Different views of the carrier plate are shown in FIGS. 10 to 13. Different views of the cover are shown in FIGS. 14 to 16.

The housing includes a carrier plate 2 on which two resistor elements 11, 12 aligned on edge are arranged at a distance from each other. The main surfaces of the resistor elements are aligned parallel to each other.

Between the resistor elements 11, 12 there is a separating wall 31, which is formed by an inner housing wall, for example, the inner wall of the cover 3. This wall extends at least up to a point that lies approximately underneath soldering points 5, where the connection wires 41, 42 are attached to the electrodes of the resistor elements. It is advantageous when the separating wall extends at least up to the top side of the carrier plate 2. It is advantageous when the lower region of this wall projects into a cutout or opening 20 provided in the carrier plate 2; see FIG. 7.

The separating wall 31 can be formed alternatively by a wall projecting out of the carrier plate. This wall is formed in the carrier plate or is attached to the carrier plate. The height of this wall extends at least up to a point that lies approximately above soldering points 5, where the connection wires 41, 42 are attached to the electrodes of the resistor elements.

The structure of the, e.g., identically formed resistor elements 11, 12 is explained in FIG. 3. The resistor element comprises a base body 15 and two layer electrodes 16, 17, between which the base body 15 is arranged.

A first connection wire 41 is connected to the first electrode 16 and a second connection wire is connected to the second electrode 17. The manner of connection may be soldering. Soldering points 5 that increase the overall width of the resistor element are formed at the junctions of the electrodes 16, 17 and the connection wires 41, 42.

Soldering point 5 may be situated roughly in the center of the main surface of the resistor elements or electrodes 16, 17. Deviations from this are possible. However, a minimum distance between the soldering point and the lowest area of the resistor element is advantageous because—as explained in FIG. 6—the lower area of the resistor element is to be lowered into a cutout 29 of the carrier plate 2.

The resistor element is coated up to the connection wires 41, 42 in a variant with an electrically insulating envelope 6. This envelope also covers the soldering points 5. Therefore, two resistor elements to be kept electrically isolated from each other are arranged in one variant at a short distance from each other without the separating wall 31 between them.

The envelope 6 may have uniform thickness, which may be up to 200 μm. An insulation coating deposited, for example, in a spraying process is well suited as material for the envelope. For adequate edge coverage it is advantageous if the body does not have sharp edges. Its edges could be flattened, for example, by beveling them. Rounded edges are also advantageous.

The connection wires 41, 42 are guided so that they have a region that runs at an indication. This region extends along the main surface of the resistor element. The second connection wire 42 may form an angle relative to the first connection wire 41. This angle can equal, for example, between 60° and 120°. The connection wire 41, 42 is angled or bent in its further profile, so that its lower region is aligned essentially vertically.

The connection wire 41, 42 is passed through an opening 28 of the carrier plate 2. The diameter of the opening 28 may be greater than that of the connection wire 41, 42. Fixing the resistor element on the carrier plate is possible in that the openings 28 may be adapted rather precisely in the lower region to the diameter of the connection wires.

The end of the wire 41, 42, which is provided for the electrical contacting of the resistor element and which projects from the carrier plate, may be bent so that it is aligned parallel to the base surface of the carrier plate. This free wire end has a contact area 43, which forms an outer contact of the resistor element and the assembly.

Figure 6:
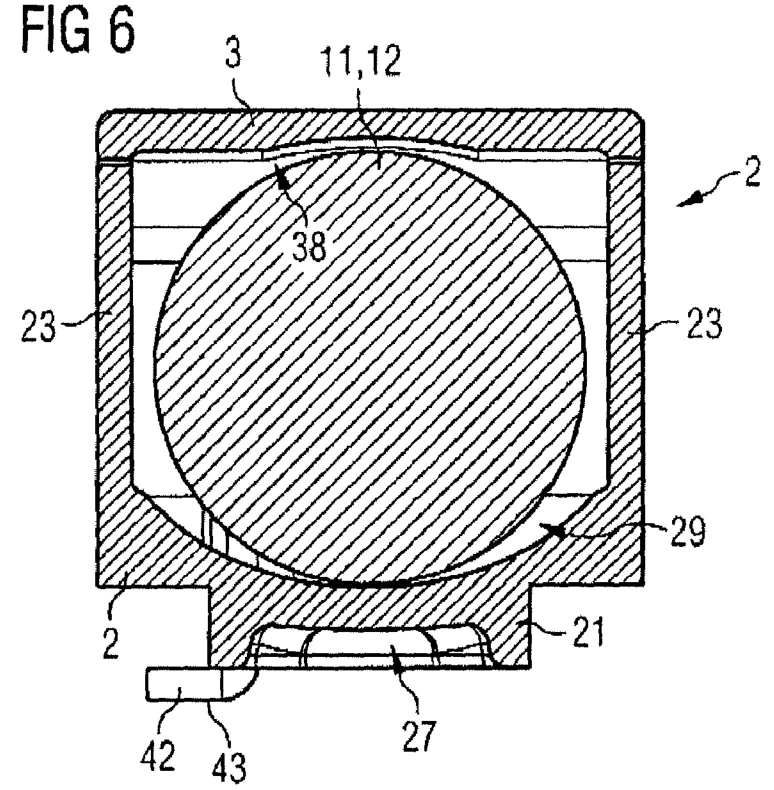
FIG. 6, the assembly according to FIG. 1 in cross section.
Figure 7:
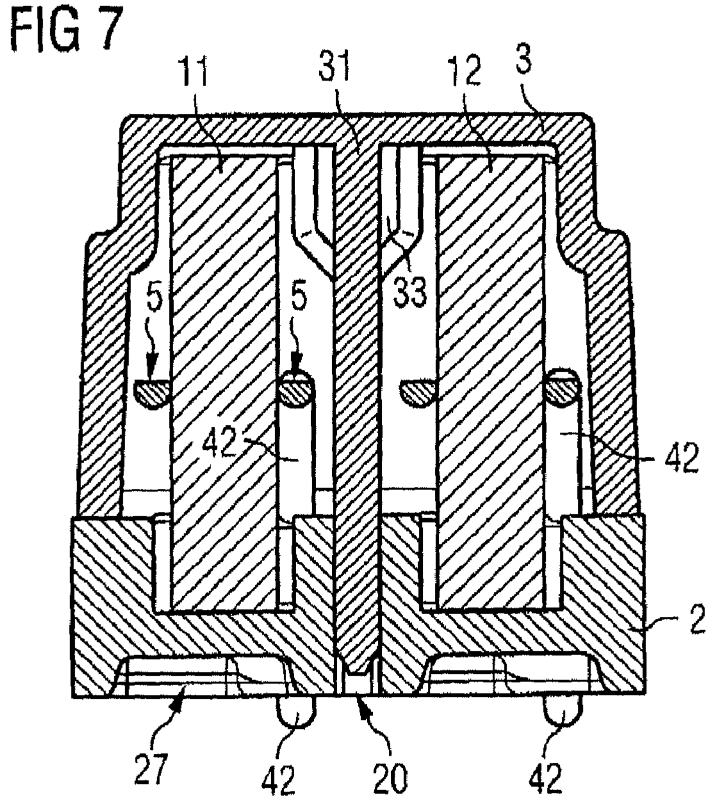
FIG. 7, the assembly according to FIG. 1 in longitudinal section.
Figure 8:
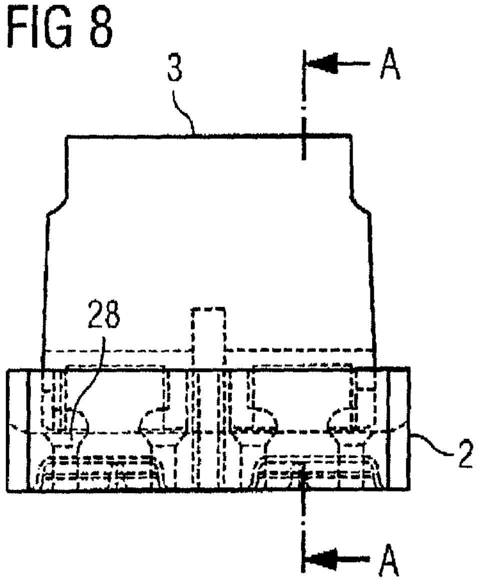
FIG. 8, a side view of the housing of the assembly according to FIG. 1.
Figure 9:
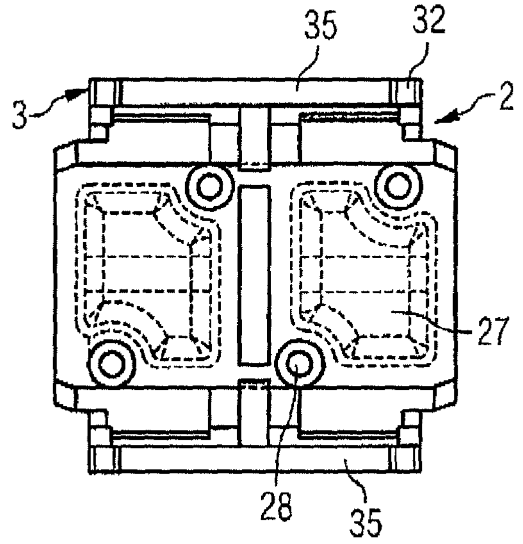
FIG. 9, a horizontal projection of the bottom side of the carrier plate of the housing according to FIG. 8.
Figure 10:
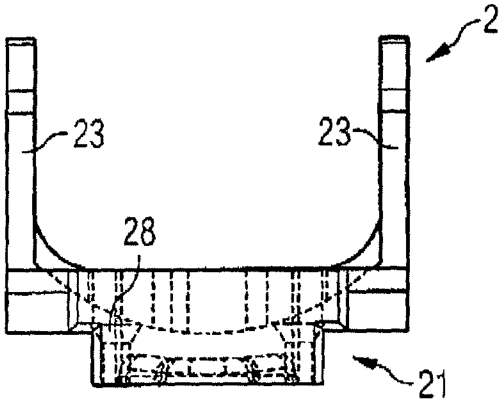
FIG. 10, the carrier plate of the housing according to FIG. 8 in partial cross section.
Figure 11:
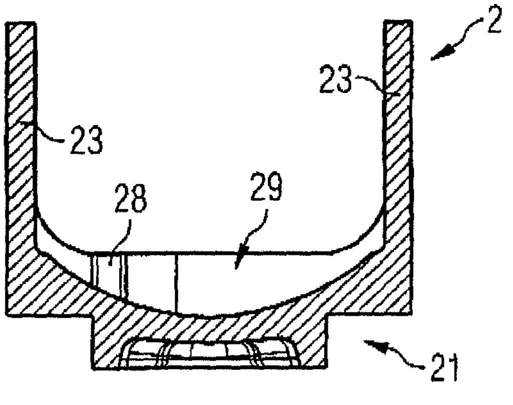
FIG. 11, the carrier plate of the housing according to FIG. 8 in cross section.
Figure 12:
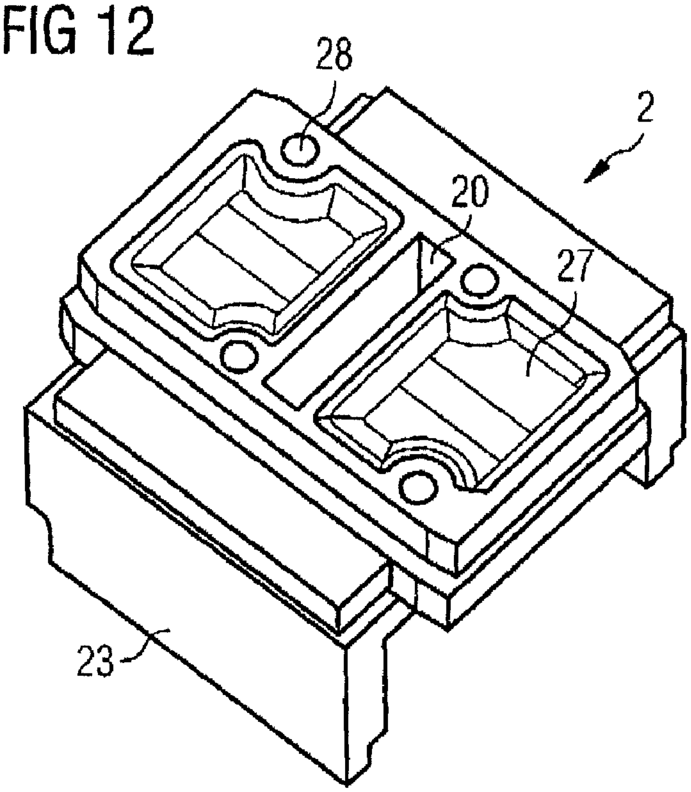
FIG. 12, the carrier plate of the housing according to FIG. 8 in a perspective view from below.

The carrier plate 2 has a base area 21, which is lower relative to an upper region of the carrier plate; see FIG. 6. Therefore, the contact area 43 arranged at the end of the connection wires 41, 42 is made accessible for contact, e.g., by a probe tip of a test device.

The carrier plate 2 has cutouts 27, which are arranged on the bottom side. The purpose of these cutouts, among others is to save material in the production of the carrier plate. These cutouts have an uneven base, so that a minimum thickness of the carrier plate 2 is guaranteed despite the cutouts 29.

Each of the cutouts 29 is provided for receiving a lower area of the resistor element 11, 12.

In principle, the disk-shaped resistor element can be shifted laterally after installation in the carrier plate through rolling relative to its starting position.

To prevent of the disk-shaped resistor element from rolling away, the base of the cutout 29 is constructed, and raised outward, so that for the lateral shifting of the resistor element, restoring forces are generated that bring the resistor element back into its starting position. The base of the cutout 29 may follow in cross section a circular arc with a greater radius than that of the resistor element.

Figure 13:
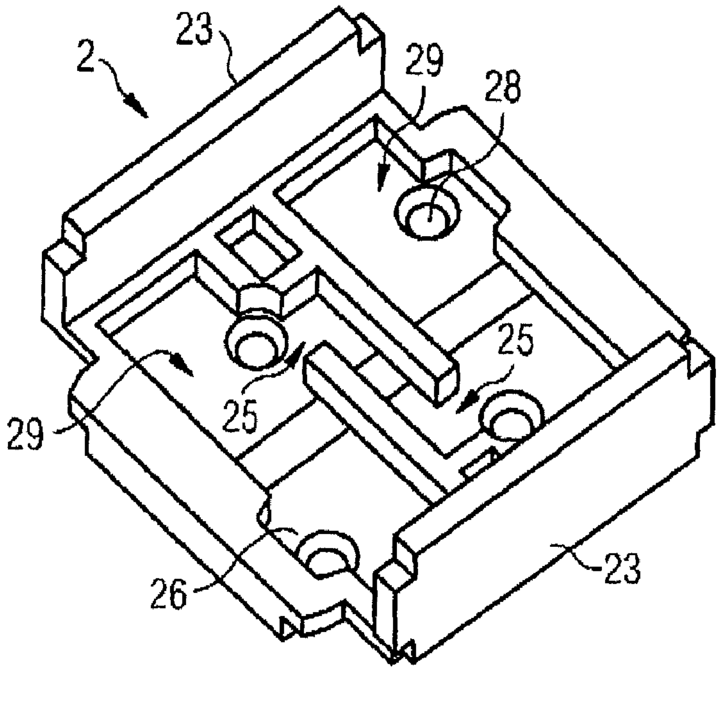
FIG. 13, the carrier plate of the housing according to FIG. 8 in a perspective view from above.

The carrier plate 2 has cutouts 26, which are shown in FIG. 13 and in which a part of the connection wire facing outward in each resistor element 11, 12 is housed. The carrier plate 2 also has cutouts 25, in which a part of the connection wire facing inward in each resistor element 11, 12 is arranged. With these cutouts it is possible to reduce the length of the housing.

The carrier plate 2 has two side walls 23 opposite each other. In principle, other side walls could be provided. The carrier plate can be constructed, for example, in the form of a trough. The housing has a cover 3, two open sides, and two opposing side walls 35, which may be aligned essentially perpendicular to the longitudinal direction of the assembly. However, it is also possible that all of the side walls of the housing are formed by the side walls of the cover 3. The cover is then constructed in the form of a cap that may have a rectangular base.

At least one wall of the housing may be formed by a side wall of the cover and a side wall of the carrier plate adapted in shape to this cover.

The cover 3 is fixed by catch devices 32 to end sides of the carrier plate 2. The catch devices are formed, for example, as snap hooks. The catch devices could be replaced by other attachment elements. The cover and the carrier plate could be connected to each other, e.g., by rivets, screws, or adhesion.

The cover 3 has a cutout 38, which extends in the longitudinal direction of the assembly. This cutout has the shape of a flat and relatively wide groove. Upper regions of the resistor elements 11, 12 project into these cutouts. They are used as a positioning element, which acts similarly to the cutout 29 of the carrier plate 2 against the rolling of the resistor element. The base of the cutout 38 is somewhat flattened, so that a given minimum thickness of the cover 3 is guaranteed in the region of this cutout.

The cutouts 29 of the carrier plate 2 and the cutout 38 of the cover 3 are advantageous, because they are used, among other purposes, for reducing the overall height of the assembly.

The cover 3 has centering devices 33, which are arranged between the resistor elements 11, 12 and which prevent these elements from falling out of vertical alignment. They can have a nub-like form or they can be constructed like flat elements as shown in FIGS. 14, 15. There may be a narrow gap for taking into account tolerances in thickness between the centering devices 33 and the resistor elements in the production of the body 15.

The possible constructions of the presented component, especially as concerns the shape of components of the carrier plate and the cover, have not been exhausted by the variants explained in the figures. The cutouts and recesses can have any arbitrary shape. Furthermore, additional cutouts or openings could be provided. The number of resistor elements can be greater than two.

The separating wall 31 can be constructed so wide that it extends up to the side walls 23, 35 of the housing. Thus, a separate closed cell is formed for each of the resistor elements 11, 12.

The invention claimed is:

1. An electrical assembly comprising:
- a housing; and
- at least two PTC (Positive Temperature Coefficient) resistor elements in the housing;
- wherein each of the at least two PTC resistor elements comprises:
  - a body having a flat construction; and
  - electrodes on main surfaces of the body;
- wherein the electrical assembly further comprises a connection wire soldered to each electrode at a soldering point;
- wherein each of the at least two PTC resistor elements comprises an electrically insulating envelope;
- wherein the housing is closed; and
- wherein the housing comprises a separating wall between the at least two PTC resistor elements at least in a region of soldering points at which connection wires are soldered to electrodes.

2. The electrical assembly of claim 1, wherein the housing comprises a carrier plate, the at least two PTC resistor elements being on the carrier plate.

3. The electrical assembly of claim 2, wherein the housing comprises a cover mounted on the carrier plate.

4. The electrical assembly of claim 3, wherein the separating wall comprises an inner wall of the cover, and wherein a region of the separating wall is in an opening of a carrier plate of the housing.

5. The electrical assembly of claim 2, wherein sections of the at least two PTC resistor elements are countersunk in cutouts in the carrier plate.

6. The electrical assembly of claim 1, wherein the at least two PTC resistor elements are aligned on edge.

7. The electrical assembly of claim 1, wherein the envelope covers soldering points at which connection wires are soldered to electrodes.

8. The electrical assembly of claim 1, wherein a thickness of the envelope does not exceed 200 μm.

9. The electrical assembly of claim 1, wherein a thickness of the envelope is essentially uniform at the main surfaces and at edges of the body.

10. The electrical assembly of claim 1, wherein the body comprises flattened edges.

11. The electrical assembly of claim 1, wherein openings through which the connection wires pass are in a carrier plate of the housing.

12. The electrical assembly of claim 1, wherein the housing comprises a thermoplastic.

13. The electrical assembly of claim 1, wherein the housing comprises a fiberglass-reinforced material.

14. The electrical assembly of claim 1, wherein the housing comprises a polymer-based material.

15. The electrical assembly of claim 1, wherein the housing is dimensionally stable up to at least 250° C.

16. The electrical assembly of claim 1, wherein each of the at least two PTC resistor elements is dimensioned in terms of resistance value, switch point of body material, and geometry, so that each of the at least two PTC resistor elements has a protection level below 500 mA.

* * * * *